US008681801B2

(12) United States Patent
Li et al.

(10) Patent No.: US 8,681,801 B2
(45) Date of Patent: Mar. 25, 2014

(54) METHOD AND APPARATUS FOR DETERMINING AVAILABLE BANDWIDTH FOR WIRELESS COMMUNICATION

(75) Inventors: Li Li, Edison, NJ (US); Sungro Yoon, Seoul (KR); Michael G. Zierdt, Hillsborough, NJ (US)

(73) Assignee: Alcatel Lucent, Paris (FR)

( * ) Notice: Subject to any disclaimer, the term of this patent is extended or adjusted under 35 U.S.C. 154(b) by 41 days.

(21) Appl. No.: 13/416,050

(22) Filed: Mar. 9, 2012

(65) Prior Publication Data
US 2013/0237167 A1 Sep. 12, 2013

(51) Int. Cl.
*H04L 12/28* (2006.01)
(52) U.S. Cl.
USPC ...................... 370/395.21; 370/232
(58) Field of Classification Search
USPC ............. 455/453, 464, 403; 370/395.64, 252, 370/232, 230, 329
See application file for complete search history.

(56) References Cited

U.S. PATENT DOCUMENTS

| | | | | |
|---|---|---|---|---|
| 6,657,958 B1 * | 12/2003 | Tanaka | ....................... | 370/230.1 |
| 6,820,117 B1 * | 11/2004 | Johnson | ........................ | 709/223 |
| 6,928,069 B2 * | 8/2005 | Nakanishi | ..................... | 370/352 |
| 7,089,016 B2 * | 8/2006 | Dokko | ........................ | 455/452.1 |
| 7,411,962 B2 * | 8/2008 | Berger et al. | ............ | 370/395.64 |
| 7,423,966 B2 * | 9/2008 | Xu | ................................. | 370/230 |
| 7,453,843 B2 * | 11/2008 | Mowery et al. | ............... | 370/329 |
| 7,558,202 B2 * | 7/2009 | Luo et al. | ...................... | 370/232 |
| 2012/0209946 A1 * | 8/2012 | McClure et al. | .............. | 709/217 |

FOREIGN PATENT DOCUMENTS

EP  1954002 A2 * 1/2008 ............. H04L 29/06

* cited by examiner

*Primary Examiner* — Sonny Trinh
(74) *Attorney, Agent, or Firm* — Harness, Dickey & Pierce

(57) ABSTRACT

In one embodiment, the method includes determining if a next interval of a bandwidth is available if an interval of the bandwidth preceding the next interval was determined to be available such that the next interval is larger than the preceding interval.

22 Claims, 5 Drawing Sheets

METHOD AND APPARATUS FOR DETERMINING AVAILABLE BANDWIDTH FOR WIRELESS COMMUNICATION

BACKGROUND OF THE INVENTION

The US government has set a goal of freeing up 500 MHz of spectrum for wireless communication. A large portion of this will come from incumbents. Accordingly, dynamic spectrum access (DSA) will be beneficial to harnessing the new spectrum. DSA networking involves discovering available channels for DSA devices to communicate at a particular time and location. Currently, there are two expected approaches: one is to query a geo-location database to obtain information on unoccupied channels in a particular location; and the other is to let DSA devices sense/search a wide band of radio frequency and find unused channels.

Most prior work on wide band spectrum sensing can be classified into two types: sequential scan and wideband scan. Both performed in the digital domain. Sequential scan requires only a narrow-band radio, but is very slow if there are hundreds or thousands of channels since each channel is scanned in sequence. Since each scan on one channel may take several msec to several hundreds of msec, it could easily take tens of seconds to find all available channels. Wideband scan uses a wideband radio with high speed analog-to-digital converters (ADCs). A wideband radio is expensive and also very power consuming. Not only does the high speed ADC consumes significant power, but also more computations are needed to process the large amount of samples that leads to a higher power cost. Such price and power costs make sensing at the Nyquist sampling rate prohibitive to mobile devices.

SUMMARY OF THE INVENTION

At least one embodiment relates to method of determining available bandwidth.

In one embodiment, the method includes determining if a next interval of a bandwidth is available if an interval of the bandwidth preceding the next interval was determined to be available such that the next interval is larger than the preceding interval.

At least one embodiment relates to an apparatus for determining available bandwidth.

In one embodiment, the apparatus includes a tunable analog filter configured to selectively filter a received signal, a detector configured to detect energy in output from the filter, and a controller configured to determine if a next interval of a bandwidth is available if an interval of the bandwidth preceding the next interval was determined to be available such that the next interval is larger than the preceding interval. The controller is configured to perform the determination based on output from the detector, and the controller is configured to set the pass-band of the filter to the next interval.

In another embodiment, the apparatus includes a plurality of filters, each configured to filter a received signal using a different pass-band. The apparatus further includes a plurality of detectors, each detector associated with one of the plurality of filters and configured to detect energy in output from the associated filter. A controller in the apparatus is configured to determine if a next interval of a bandwidth is available if an interval of the bandwidth preceding the next interval was determined to be available such that the next interval is larger than the preceding interval. The controller is configured to perform the determination based on output from the plurality of detectors.

BRIEF DESCRIPTION OF THE DRAWINGS

The example embodiments will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Figure 1:
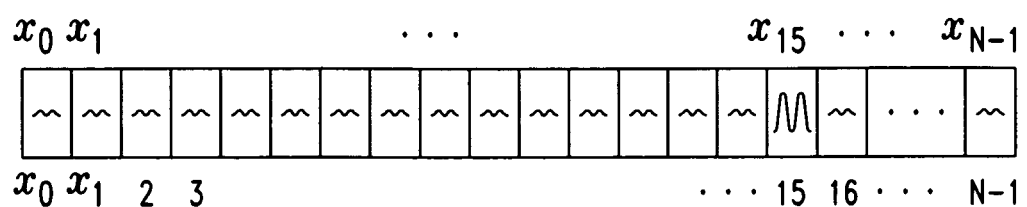
FIG. 1 illustrates an example of a wideband spectrum divided into a number of channels.

Various example embodiments will now be described more fully with reference to the accompanying drawings in which some example embodiments are shown.

While example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of algorithms performed by a controller. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at existing network elements, existing end-user devices and/or post-processing tools (e.g., mobile devices, laptop computers, desktop computers, etc.). Such existing hardware may include one or more Central Processing Units (CPUs), digital signal processors (DSPs), application-specific-integrated-circuits, field programmable gate arrays (FPGAs) computers or the like.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

Note also that the software implemented aspects of example embodiments are typically encoded on some form of tangible (or recording) storage medium or implemented over some type of transmission medium. As disclosed herein, the term "storage medium" may represent one or more devices for storing data, including read only memory (ROM), random access memory (RAM), magnetic RAM, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks.

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

FIG. 1 illustrates an example of a wideband spectrum divided into a number of channels. As shown, the wideband spectrum includes N channels $x_0, \ldots, x_{N-1}$. FIG. 1 will be referred to in describing the apparatuses and methods of the example embodiments.

Figure 2:
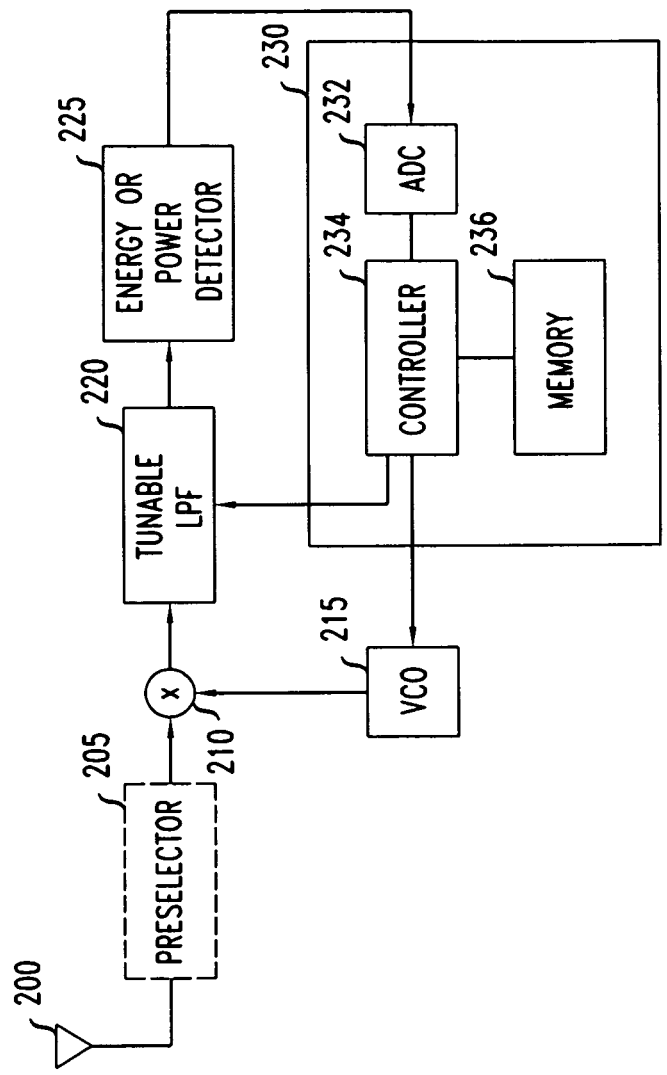
FIG. 2 illustrates an apparatus for determining available channels in a wideband spectrum according to an embodiment.

FIG. 2 illustrates an apparatus for determining available channels in a wideband spectrum according to an embodiment. The apparatus forms part of or a module of a DSA radio or mobile station. As used herein, the term "mobile station" may be synonymous to a mobile user, user equipment or UE, mobile terminal, user, subscriber, wireless terminal, terminal, and/or remote station and may describe a remote user of wireless resources in a wireless communication network. Accordingly, a mobile station (MS) may be a wireless phone, wireless equipped laptop, wireless equipped appliance, etc.

As shown, the apparatus shares the same antenna 200 as the DSA mobile station. As will be appreciated from this description, the apparatus works alongside the other components of the DSA mobile station, and does not interfere with the transmission and reception of the DSA mobile station.

As indicated by dashed-lines, the apparatus may optionally include a preselector 205. This will depend on the frequency band of interest. The preselector 205 filters out or rejects out-of-band unwanted interference signals. A mixer 210 receives the output of the antenna 200, or optionally, the preselector 205, and brings the received wideband signal down to baseband under the control of a voltage controlled oscillator (VCO) 215. Namely, the mixer 210 mixes the wideband signal with a mixing signal output from the VCO 215.

An analog tunable low-pass filter 220 filters the baseband signal output from the mixer 210, and an energy detector 225 detects the energy (or power) in the output of the low-pass filter 220. A control unit 230 receives the output from the detector 225, and controls the VCO 215 and the tunable low pass-filter 220. In particular, the control unit 230 may control the offset frequency of the baseband signal produced by the mixer 215 by controlling the output of the VCO 215. The control unit 230 may control the pass-band of the tunable low-pass filter 220.

The control unit 230 may include an analog-to-digital converter 232, a controller or processor 234 and a memory 236. The controller 234 executes one or more programs stored in the memory 236 to control the VCO 215 and the low-pass filter 220 and may store variable values, etc. in the memory 236 in performing these operations. In particular, the controller 234 controls these elements to implement a method for determining available channels in a wideband spectrum according to an embodiment. As such, the controller 234 is a specific purpose computing device as set forth, for example, in embodiment of FIGS. 3A-3B.

Figure 3A:
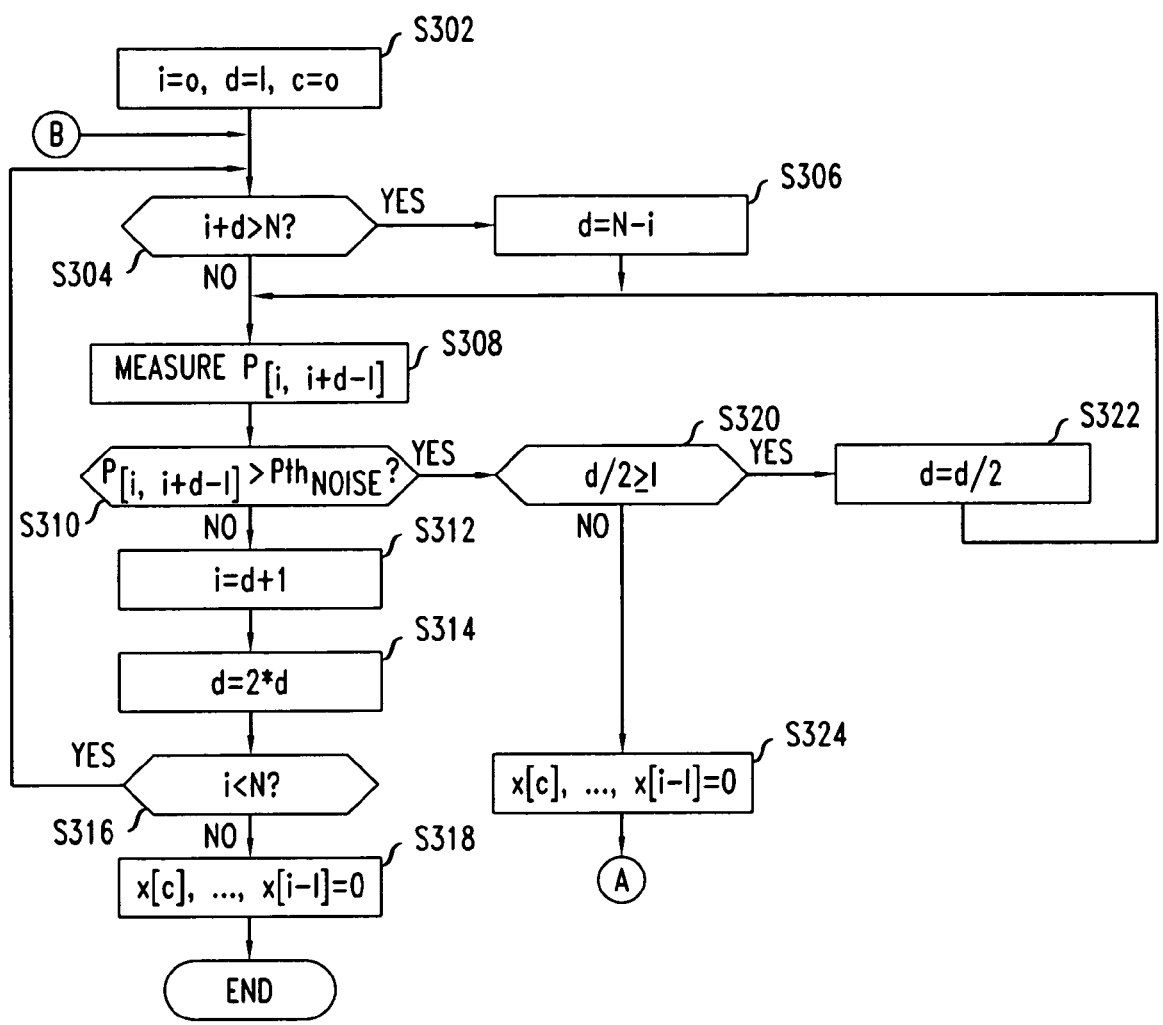
FIGS. 3A-3B illustrate a flowchart of a method for determining available channels in a wideband spectrum according to an embodiment.
Figure 3B:
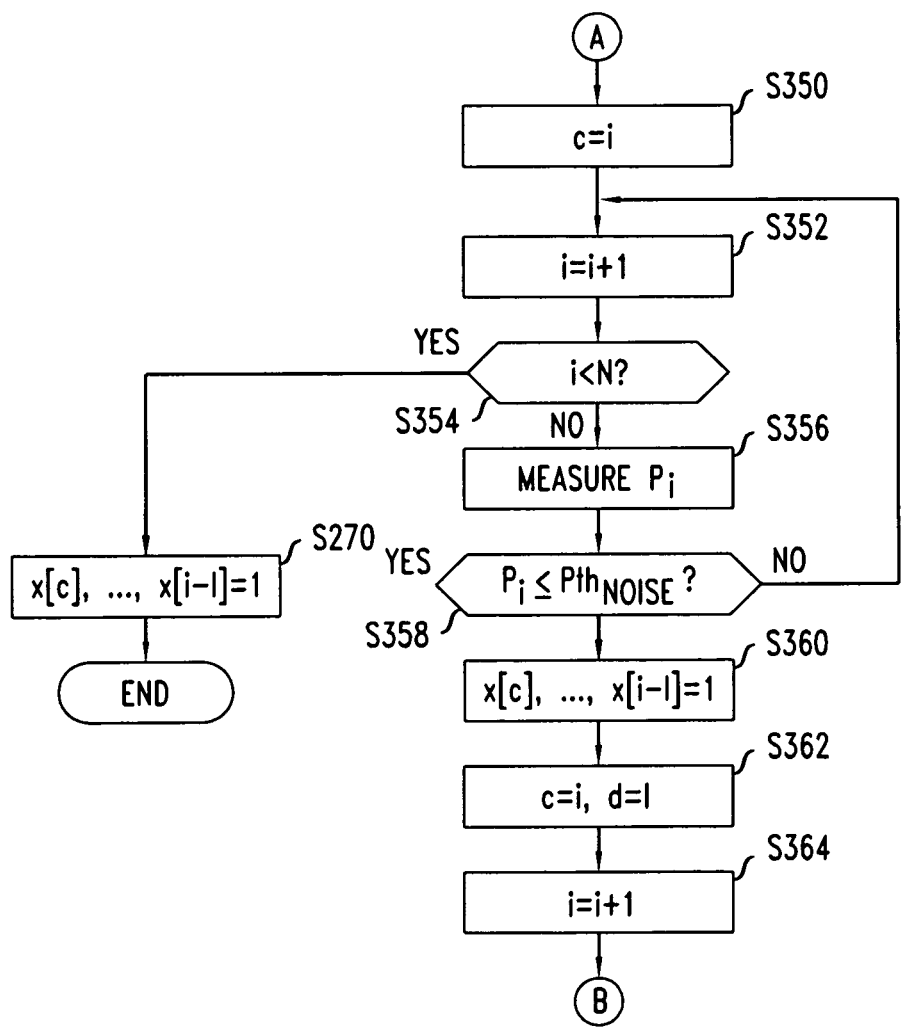

FIGS. 3A-3B illustrate a flowchart of a method for determining available channels in a wideband spectrum according to an embodiment. For the sake of clarity, this method will be described as implemented by the apparatus of FIG. 2, and with reference to the wideband spectrum shown in FIG. 1. As shown, in step S302, the controller 234 initializes variables i, d and c to zero. The variable i will be referred to as a current channel i (where i may equal 0 to N−1 if the total number of channels is N), the variable d will be referred to as the interval size d, and the variable c will be referred to as first channel during a sensing operation. Next, the controller 234 begins a sensing iteration for available channels.

In step S304, the controller 234 determines if the current channel i plus the interval size d is greater than the number of channels N in the wideband spectrum. If so, the interval size d is set equal to N−i in step S306 so that the interval size equals the remaining number of channels in the wideband spectrum.

After step S304 or S306, the controller 234 obtains the energy or power over the bandwidth interval of [i, i+d−1] in step S308. As will be appreciated, intervals of bandwidth will be expressed in terms of channels, and will use the notation established with respect to FIG. 1. As shown in FIG. 1, a wideband spectrum has channels 0, 1, . . . , N−1. During a first iteration with i=0 and d=1, the controller 234 obtains power or energy P[0,0] over the first channel 0 in the wideband spectrum (please note the terminology power and energy will be used interchangeably in this disclosure). For example, in one embodiment, the controller 234 controls the VCO 215 such that the mixer 210 outputs a baseband spectrum with a center frequency at channel 0. The controller 234 also controls the low-pass filter (LPF) 220 to have a pass-band of [0,0], which is equal to the first channel 0. In this manner, the energy detected by the detector 225 is that of the signal $x_0$ on the first channel 0.

In step S310, the controller 234 determines if the power detected in step S308 exceeds a noise power threshold $Pth_{noise}$. In one example embodiment, an empirically determined noise power threshold may be used. In another example embodiment, the controller 234 learns the background noise power $P_{noise}[j]$ for each channel j, where j=0, . . . , N−1. During start-up or initialization of the DSA mobile station, the controller 234 may detect the power over individual channels, and average the measurements for each channel that fall below an empirically determined threshold (i.e., measurements considered to be noise power measurements). Still further, during operation, the noise measurements may be updated based on measurements over the individual channels that fall below this threshold. In this manner, a noise power $P_{noise}[j]$ for each channel j is determined. The operation of taking these measurements and obtaining the average noise power per channel, may be performed as a separate process running simultaneously with other operations during idle times of the DSA mobile station.

During operation, such as in the method of FIGS. 3A-3B, the obtained noise power for each channel may be used to create the noise threshold $Pth_{noise}$ used in steps S310 and S358. In particular, the noise threshold $Pth_{noise}$ during each iteration of step S310 or step S358 will depend on the energy measurement interval in step S308 and step S356, respectively. The obtained noise power for each channel in the measurement interval is added together to determine the noise threshold $Pth_{noise}$. For example, with respect to the measurement interval [3,6], $Pth_{noise}=P_{noise}[3]+P_{noise}[4]+P_{noise}[5]+P_{noise}[6]$.

If the detected power does not exceed the noise power threshold $Pth_{noise}$ the controller 234 concludes that no signal is present in any channel included in the current interval, and therefore, each channel in the current interval is available for use by the DSA mobile station. If the detected power does not exceed the noise power threshold, then the current channel is incremented by the current interval size d in step S312, and the interval size d is subsequently increased in step S314. For example, the interval size is doubled. The example embodiments are not limited to this method of increase. However, the method of increase is expected to provide a greater interval size than the preceding interval.

Next, in step S316, the controller 234 determines if the current channel i is less than the total number of channels N. If so, then processing returns to step S304, where if the current channel i plus the interval size d is less than the total number of channels N, the power or energy over the next interval is detected in step S308. As will be appreciated, each iteration results in detecting power over a larger interval. Stated another way, the next interval is larger than the preceding interval, unless the end of the spectrum is reached (see step S306). For the interval increment shown in step S314 (e.g., doubling), the interval over subsequent iterations will be [0,0], [1,2], [3,6],[7,14], etc. For example, the interval [3,6] means that the controller 234 will obtain the power or energy over an interval that includes channels 3, 4, 5 and 6. In this manner, larger and larger intervals of spectrum may be determined as available. This significantly reduces the time and cost of determining available spectrum.

Returning to step S316, if the current channel i is not less than total number of channels N, the controller 234 determines that sensing of the entire spectrum has been completed. Then in step S318, the controller 234 determines the channels from start channel c to i−1 do not include signals (i.e., x[c], . . . , x[i−1]=0), and are available.

Returning now to step S310, if the controller 234 determines that the measured power over the interval [i, i+d−1] exceeds the noise power threshold, then the controller 234 determines that the interval includes a signal on one or more channels and conducts a search for the channel or channels including a signal. In particular, in step S320, the controller 320 determines if the interval size d divided by two is greater than or equal to one. If not, then the interval size d is divided in half in step S322, and processing returns to step S308. As an example, and with reference to FIG. 1, suppose N=64 and only channel 15 is occupied. The controller 234 first identifies the channels in the intervals [0,0], [1,2], [3,6] and [7,14] as being available before determining that the interval [15,30] includes at least one unavailable channel. As will be appreciated, during this interval, the current channel i equals 15, and the interval size d equals 16. Accordingly, in step S322, the interval size is reduced to d=8, and the power is detected over the interval [15,22] in step S308. Because channel 15 includes the signal, this reduction of the interval will repeat producing further reduction intervals of [15,18], [15,16], and finally [15,15]. When the interval [15,15] is reached, the controller 234 will determine in step S320 that the interval size d divided by two is less than 1, and processing will proceed to step S324. In this step, the controller 234 determines the channels from channel c to i−1 do not include signals (i.e., x[c], . . . , x[i−1]=0), and are available. In our example, channels 0-14 do not include signals. Processing then proceeds to a sequential signal sensing operation illustrated in FIG. 3B.

As shown in FIG. 3B, the first channel c during this sensing operation is set to the current channel i in step S350 by the controller 234. For example, c=15 in our example above. Then, the current channel i is incremented by 1 in step S352. For example, i will now equal 16 in our example above. Namely, the previous sensing operation for available channels has already determined that channel 15 includes a signal, so that channel does not need to undergo detection again. Instead, the signal sensing operation proceeds to the next channel (e.g., 16 in our example).

In step S354, the controller 234 determines if the current channel i exceeds the total number of channels N. If not, then the controller 234 obtains the power or energy in the current channel i in step S356, and then determines if the detected energy in channel i is less than or equal to the noise threshold (e.g., $Pth_{noise}[i]$) in step S358. If the detected energy in the channel i is not less than or equal to the noise threshold $Pth_{noise}[i]$, then the controller 234 concludes this channel includes a signal and processing returns to step S352 so that the next channel may undergo sensing. However, if the detected energy of the channel i is less than or equal to the noise threshold, the controller 234 determines this channel is available, and processing proceeds to step S360. In this step, the controller 234 determines the channels from channel c to i−1 include signals (i.e., x[c], . . . , x[i−1]=1), and are unavailable. In our example, only channel 15 includes a signal.

In step S362, the controller 234 sets the first channel c for the next sensing operation equal to the channel i, and sets the interval size d for the available channel sensing operation equal to 1. The channel i is then set to i=i+1 by the controller 234 in step S364, and processing returns to step S304 as described above.

Returning to step S354, if the controller 234 determines that the current channel number i exceeds the total number of channels N, then in step S370, the controller 234 determines the channels from channel c to i−1 include signals (i.e., x[c], . . . , x[i−1]=1), are unavailable, and processing ends.

Figure 4:
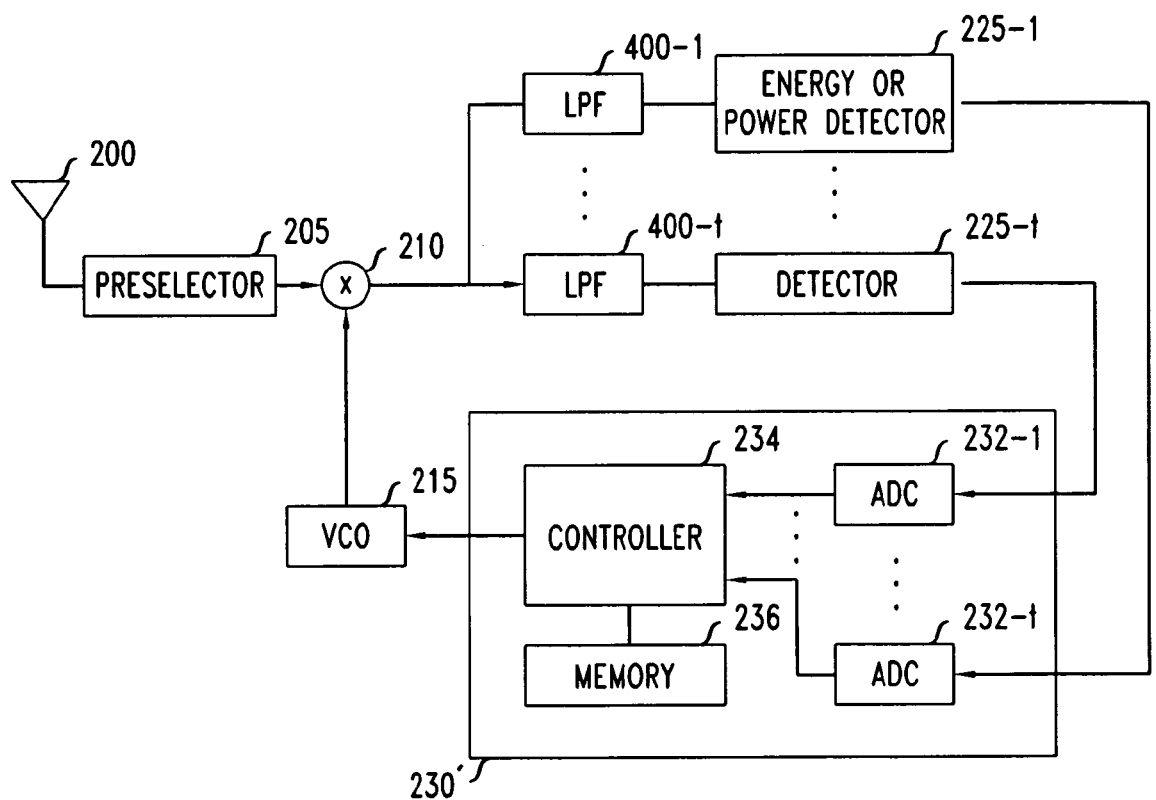
FIG. 4 illustrates an apparatus for determining available channels in a wideband spectrum according to another embodiment.

FIG. 4 illustrates an apparatus for determining available channels in a wideband spectrum according to another embodiment. In this embodiment, the tunable low-pass filter 220 has been replaced by a plurality of low-pass filters 400-1, . . . , 400-t; where t is an integer greater than 1. For example, the tunable filter 220 in the embodiment of FIG. 2 is required to filter a maximum of $\log_2(N)$ different bandwidths. Accordingly, the tunable filter 220 can be replaced with t=$\log_2(N)$ fixed low pass filters 400 in the embodiment of FIG. 4. These fixed low pass filters 400-1, 400-2, 400-3, 400-4, . . . may have filter bands of [i,i], [i,i+1], [i,i+3], [i,i+7], etc.

Also, the embodiment of FIG. 4 includes an associated plurality of detectors 225, and in the control unit 230', an associated plurality of ADCs 232.

The same methodology as the embodiment of FIGS. 3A-3B may be employed. For example, to obtain the energy in the interval [i+2,i+3], the controller 234 subtracts the energy detected in the interval [i,i+1] from the energy detected in the interval [i,i+3]. Also, it will be appreciated that the controller 234 can control the VCO 210 such that the output from filter 400-1 would be any single channel interval. Namely, by controlling the VCO 210, the controller 234 controls the value of i. Because the methodology employed by the controller 234 in FIG. 4 is, thus, as described above with respect to FIGS. 3A-3B, this description will not be repeated.

The example embodiments being thus described, it will be apparent that the same may be varied in many ways. For example, particularly with respect to the embodiment of FIG. 4, instead of subtracting the energy measurements, the time domain signals output from the LPFs 400 may be subtracted and then the energy detected. This will reduce the number of detectors 225 and ADCs 232. Also, simulations have shown that this methodology increases the resulting signal-to-noise ratio.

As will be appreciated, the method and apparatus according the example embodiments has several advantages. First, they are very simple. The design can be implemented using only simple analog filters and analog energy detectors, which are inexpensive and power efficient. Second, no a priori knowledge of the sparsity of the spectrum occupancy is need; rather, instead the method and apparatus adapt to the sparsity gracefully.

The example embodiments being thus described, it will be obvious that the same may be varied in many ways. Such variations are not to be regarded as a departure from the invention, and all such modifications are intended to be included within the scope of the invention.

We claim:

1. A method of determining available bandwidth, comprising:
   detecting, by a processor, energy in a next interval of bandwidth; and
   determining, by the processor, if the next interval of a bandwidth is available if an interval of the bandwidth preceding the next interval was determined to be available such that the next interval is larger than the preceding interval, the determining determines whether the next interval is available based on the detected energy and a threshold.

2. The method of claim 1, further comprising:
   measuring noise energy in each channel of the bandwidth;
   determining the threshold based on the measured noise energy associated with each channel in the next interval.

3. The method of claim 1, wherein the determining comprises:
   filtering a signal using an analog low-pass filter, the low-pass filter having the next interval as a pass-band; and wherein
   the detecting detects energy output from the low-pass filter.

4. The method of claim 1, wherein the determining comprises:
   filtering a signal using a first analog low-pass filter, the first analog low-pass filter having a pass-band from a starting frequency to a first end frequency, the first end frequency being an end of the next interval;
   filtering the signal using a second analog low-pass filter, the second analog low-Pass filter having a pass-band from the starting frequency to a second end frequency, the second end frequency being an end of the preceding interval;
   detecting first energy in output from the first analog low-pass filter;
   detecting second energy in output from the second analog low-pass filter; and determining whether the next interval is available based on a difference between the first energy and the second energy.

5. The method of claim 1, wherein the determining comprises:
filtering a signal using a first analog low-pass filter, the first analog low-pass filter having a pass-band from a starting frequency to a first end frequency, the first end frequency being an end of the next interval;
filtering the signal using a second analog low-pass filter, the second analog low-Pass filter having a pass-band from the starting frequency to a second end frequency, the second end frequency being an end of the preceding interval;
subtracting, in a time domain, output of the second analog low-pass filter from output of the first analog low-pass filter; and
detecting energy in output from the subtractor; and
determining whether the next interval is available based on the detected energy.

6. The method of claim 1, wherein the next interval does not overlap the preceding interval.

7. The method of claim 1, wherein the next interval is double a size of the preceding interval.

8. The method of claim 1, further comprising:
identifying each channel in the next interval as available if the next interval is determined to be available.

9. The method of claim 1, further comprising:
identifying at least one channel in the next interval as unavailable if the determining determines the next interval is not available.

10. The method of claim 9, further comprising:
repeating the determining if a next interval of a bandwidth is available using a first available channel following an identified unavailable channel as the preceding interval.

11. A method of determining available bandwidth, comprising:
determining, by a processor, if a next interval of a bandwidth is available if an interval of the bandwidth preceding the next interval was determined to be available such that the next interval is larger than the preceding interval;
identifying, by the processor, at least one channel in the next interval as unavailable if the determining determines the next interval is not available;
reducing the next interval if the next interval is greater than one channel; and
determining if the reduced next interval is available.

12. The method of claim 11, wherein the identifying comprises:
repeating the reducing and determining if the reduced next interval is available until one of (i) the reduced next interval is determined to be available, and (ii) the reducing the reduced next interval would reduce the reduced next interval to less than one channel.

13. The method of claim 12, wherein the identifying comprises:
identifying the channel represented by the reduced next interval as unavailable if reducing the reduced next interval would reduce the reduced next interval to less than one channel.

14. The method of claim 13, further comprising:
determining if a next channel succeeding the identified channel is available;
identifying the next channel as unavailable if the next channel is not determined to be available; and
repeating the determining if a next interval of a bandwidth is available using the next channel as the preceding interval if the next channel is determined to be available.

15. The method of claim 12, wherein the identifying comprises:
determining whether a next channel succeeding the reduced interval is available if the reduced interval is determined to be available;
identifying the next channel as unavailable if the next channel is not determined to be available; and
repeating the determining whether a next channel is available and the identifying the next channel using the next channel as the preceding channel until an available channel is determined.

16. The method of claim 11, wherein the reducing reduces only an end frequency of the next interval.

17. An apparatus for determining available bandwidth, comprising:
a tunable analog filter configured to selectively filter a received signal;
a detector configured to detect energy in output from the filter; and
a controller configured to determine if a next interval of a bandwidth is available if an interval of the bandwidth preceding the next interval was determined to be available such that the next interval is larger than the preceding interval, the controller configured to perform the determination based on output from the detector, and the controller configured to set the pass-band of the filter to the next interval.

18. The apparatus of claim 17, further comprising:
a voltage controlled oscillator configured to generate a mixing signal;
a mixer configured to mix the mixing signal with a radio signal; and wherein
the filter is configured to receive output of the mixer as the received signal; and
the controller is configured to control the voltage controlled oscillator.

19. An apparatus for determining available bandwidth, comprising:
a plurality of filters, each configured to filter a received signal using a different pass-band;
a plurality of detectors, each detector associated with one of the plurality of filters and configured to detect energy in output from the associated filter; and
a controller configured to determine if a next interval of a bandwidth is available if an interval of the bandwidth preceding the next interval was determined to be available such that the next interval is larger than the preceding interval, the controller configured to perform the determination based on output from the plurality of detectors.

20. The apparatus of claim 19, wherein
the plurality of detectors are further configured to,
filter a signal using a first analog low-pass filter, the first analog low-pass filter having a pass-band from a starting frequency to a first end frequency, the first end frequency being an end of the next interval, and
filter the signal using a second analog low-pass filter, the second analog low-pass filter having a pass-band from the starting frequency to a second end frequency, the second end frequency being an end of the preceding interval; and the controller is further configured to,
detect first energy in output from the first analog low-pass filter, detect second energy in output from the second analog low-pass filter, and determine whether the next interval is available based on a difference between the first energy and the second energy.

21. The apparatus of claim 19, wherein the plurality of detectors are further configured to, filter a signal using a first analog low-pass filter, the first analog low-pass filter having a pass-band from a starting frequency to a first end frequency, the first end frequency being an end of the next interval, and filter the signal using a second analog low-pass filter, the second analog low-pass filter having a pass-band from the starting frequency to a second end frequency, the second end frequency being an end of the preceding interval; and the controller is further configured to, subtract, in a time domain, output of the second analog low-pass filter from output of the first analog low-pass filter, detect energy in output from the subtractor, and determine whether the next interval is available based on the detected energy.

22. The apparatus of claim 19, wherein the next interval does not overlap the preceding interval.

* * * * *